(12) United States Patent
Knight et al.

(10) Patent No.: US 7,200,453 B2
(45) Date of Patent: Apr. 3, 2007

(54) OPTIMISATION OF THE DESIGN OF A COMPONENT

(75) Inventors: Steven Thomas Knight, Bristol (GB); Graham Harlin, Bristol (GB)

(73) Assignee: Rolls-Royce PLC, London (GB)

( * ) Notice: Subject to any disclaimer, the term of this patent is extended or adjusted under 35 U.S.C. 154(b) by 340 days.

(21) Appl. No.: 10/830,132

(22) Filed: Apr. 23, 2004

(65) Prior Publication Data
US 2004/0267393 A1 Dec. 30, 2004

(30) Foreign Application Priority Data
Jun. 13, 2003 (GB) ................. 0313599.3
Jul. 14, 2003 (GB) ................. 0316317.7

(51) Int. Cl.
*G06F 19/00* (2006.01)
(52) U.S. Cl. ............... 700/98; 382/285; 700/117; 164/137
(58) Field of Classification Search ................. 700/97, 700/98, 117; 382/285; 164/137
See application file for complete search history.

(56) References Cited

U.S. PATENT DOCUMENTS 6,341,261 B1 * 1/2002 Vasey-Glandon et al. ...... 703/6
6,434,278 B1 * 8/2002 Hashimoto ................. 382/285
6,969,836 B2 * 11/2005 Cross et al. ............. 250/208.1
2002/0088600 A1 * 7/2002 Beeck et al. ................ 164/137
2004/0227766 A1 * 11/2004 Chou et al. ................. 345/582

FOREIGN PATENT DOCUMENTS

JP       A 10-011605       1/1998

OTHER PUBLICATIONS

Barequet, Gill et al. "RSVP: A Geometric Toolkit for Controlled Repair of Solid Models." *IEEE Trans. Vis. Comput. Graphics* (USA), Apr.-Jun. 1998, vol. 4, No. 2 pp. 162-177.

* cited by examiner

*Primary Examiner*—Leo Picard
*Assistant Examiner*—Sheela S. Rao
(74) *Attorney, Agent, or Firm*—Oliff & Berridge, PLC

(57) ABSTRACT

A method of optimising a design of a component by conducting at least one analysis employing a 3D computer model which incorporates empirically obtained data values stored as 2D data sets. Ambiguities between values from different data sets which relate to common nodes, where the nodes define polygonal elements common to both 2D data sets, are resolved by determining an apparent area of said common polygonal elements from each of the at least two 2D datasets. The data value from the 2D dataset associated with the common polygonal element having the greater apparent area is used. An optimum component design is selected on the basis of the results of the analysis.

14 Claims, 5 Drawing Sheets

OPTIMISATION OF THE DESIGN OF A COMPONENT

This invention relates to a method of optimising the design of a component. More specifically, although not exclusively, the invention relates to the automation and optimisation of the design of a component using an image data capture means, a computer based finite element analysis (FEA) system, a computer aided analysis system and a method of transferring data between them.

It is known to use FEA systems when designing a component. It is also common practice to use empirical data as a basis for defining boundary conditions and properties of a component defined by a FEA model. Having defined the boundary conditions a finite element model may be imported to an analysis program to determine the suitability and limits of the design. Such analysis programs may be for analysing, for example, computational fluid dynamics, thermo-mechanical properties or mechanical properties.

Empirical data may be collected from instrumentation located on or directed towards the component. Alternatively data derived from electromagnetic radiation (e.g. visible light, Infra-red, Ultraviolet) reflected off or emitted from a component. In some cases, such as with a component coated in a temperature indicating paint, data may be transferred from the component to the FEA system by a number of means.

One method entails the manual tracing of temperature contours on the coated component which are then loaded into an imaging package. The user traces around the temperature contours on the component, assigning a value to each of the contours, thereby producing a 2D temperature contour map of the surface of the component which can be converted manually into a table relating positions on the surface to a temperature value which can be entered into the FEA system.

The above process is time consuming and prone to error.

Empirically obtained 2D image data may also be mapped onto a 3D FEA model using conventional 2D to 3D mapping mathematics. Published material to date indicates this has only been achieved to the levels of accuracy required by use of complex and labour intensive processes.

When more than one 2D data set is mapped onto the 3D computer model, for example images captured from different viewpoints, then there will be regions where for a given position on the 3D model, there may be more than one empirical value.

Conventionally in the regions where the 2D data sets overlap ambiguities are resolved by averaging the 2D data. However this will lead to errors where at a given co-ordinate, the angle of view for one data set may result in an erroneous data value which is substantially different to a data value captured from a different viewpoint.

Hence it is required to have a means for determining which empirical data value will have the highest possibility of being accurate.

According to the present invention there is provided a method of optimising a design of a component by conducting analyses of empirically obtained data values, each analysis comprising the steps of:
a) representing surface properties of said component as at least two 2D images defined by at least two 2D datasets which comprises a plurality of data values,
b) representing said component as a 3D computer model having a surface defined by a plurality of nodes, said nodes further defining a plurality of polygonal elements,
c) defining at least six features common to both the at least two 2D images and the 3D computer model,
d) identifying co-ordinates common to the at least two 2D data sets and the 3D computer model,
e) assigning data values from at least one common co-ordinate in the at least two 2D data sets to the associated nodal co-ordinate in the 3D computer model,
f) resolving ambiguities between values from the at least two 2D data sets assigned to common nodes, said nodes defining polygonal elements common to both 2D data sets, by determining an apparent area of said common polygonal elements from each of the at least two 2D datasets which contain an ambiguous value, and using the data value from the 2D dataset associated with the common polygonal element having the greater apparent area.
g) employing the 3D computer model in at least one analysis to optimise the design of the said component, the method further comprising the step of selecting an optimum component design on the basis of the results of the at least one analysis.

Preferably the method further comprises the step of mapping the at least one 2D data set onto the 3D computer model such that the properties of the 3D model surface comprise the 2D dataset.

Preferably the method further comprises the step of mapping the at least one 2D data set onto the 3D computer model such that geometric features of the 3D model surface comprise the 2D dataset.

The invention is a method for optimising the design of a component, a method of manufacturing a component comprising the design optimisation steps described herein, the resultant component, a computer program product comprising code to carry out the design optimisation steps and a computer system adapted to carry out the design optimisation steps herein described.

The invention provides a means for extracting empirical data values from a 2D data set and assigning them to nodal co-ordinates in a 3D computer model such that the data value for a given location on the component relates precisely to the same location on the 3D FEA computer model of the same component.

The invention also provides a means to transfer geometric features present in the 2D image data set to the 3D model.

As previously described empirical data relating to a component may be collected from a number of sources including, but not limited to, components coated with temperature indicating paint(s), pressure sensitive paint(s), vibration analysis, instrumentation (by way of non limiting example, strain gauges, pressure gauges, flow indicators and/or pyrometers. Such data may be used in the analysis of the component, acting as a basis for the boundary conditions of a 3D computer model of the component. This analysis may be used in either validating or modifying the design of the component and consequently aiding in the optimisation of the component.

When images are taken of a 3D object, the images are encoded as a 2D data set representation of a particular view of the 3D object. In obtaining a collection of 2D data sets which cover the full surface of the 3D object, there are regions of overlap. Consequently there are regions where there is more than one 2D data value for a particular region of the 3D component.

Clearly in order to obtain the best results from a subsequent optimisation analysis only 2D data of which there is a high degree of confidence of accuracy should be used. The invention provides a means for determining which data the user may have high confidence in.

It will be apparent to one skilled in the art that an image taken normal to a surface will reveal the best information on variation of surface properties since, by way of non limiting example, it may be less distorted, and consequently will be clearer than an image taken at an angle to a normal to a surface. Clearly if a surface is curved, there will be surface regions that are not aligned to the image viewing direction and the loss of clarity will be exacerbated.

If visual data is captured from, by way of non limiting example, a turbine stator segment for a gas turbine engine, it will be appreciated that a plurality of views of the turbine blade will have to be captured in order to collect a sufficiently complete map of the surface. A turbine stator segment has a complex shape, comprising an aerofoil having a leading and trailing edge, a pressure side and a suction side both having an arcuate shape, plus an inner and an outer shroud. There will be points of overlapping data values in each "view" and a means to determine which data is most likely to be the most accurate data is required.

If the data captured is, by way of non limiting example, that of temperature indicating paint, it will be apparent to one skilled in the art that confidence in the accuracy of data derived from a 2D image of a component is maximised when the image is captured normal to the component surface. It will also be appreciated that confidence in the accuracy of data derived from a 2D image of a component is reduced when the image is captured at an angle to the normal of the component surface.

Having assigned data values from the 2D data set onto the corresponding nodal coordinates of the 3D computer model, the present invention determines the regions of data overlap and calculates the apparent areas of the polygonal elements for the 2D data set based on the view from which the 2D image was captured, the polygonal elements being defined by the nodal co-ordinates. Hence the same element viewed at a normal to the surface of the element will have an area apparently larger than the same element viewed at an angle to the normal. The larger the apparent area of the polygonal element, the closer to the normal the 2D image was captured from. Hence the data corresponding to the polygonal element with the largest apparent area will be the most accurate data value. Hence ambiguities between data values in overlapping data sets are resolved.

For a better understanding of the present invention and to show how it may be carried into effect, reference will now be made by way of example to the accompanying drawings in which.

Figure 1:
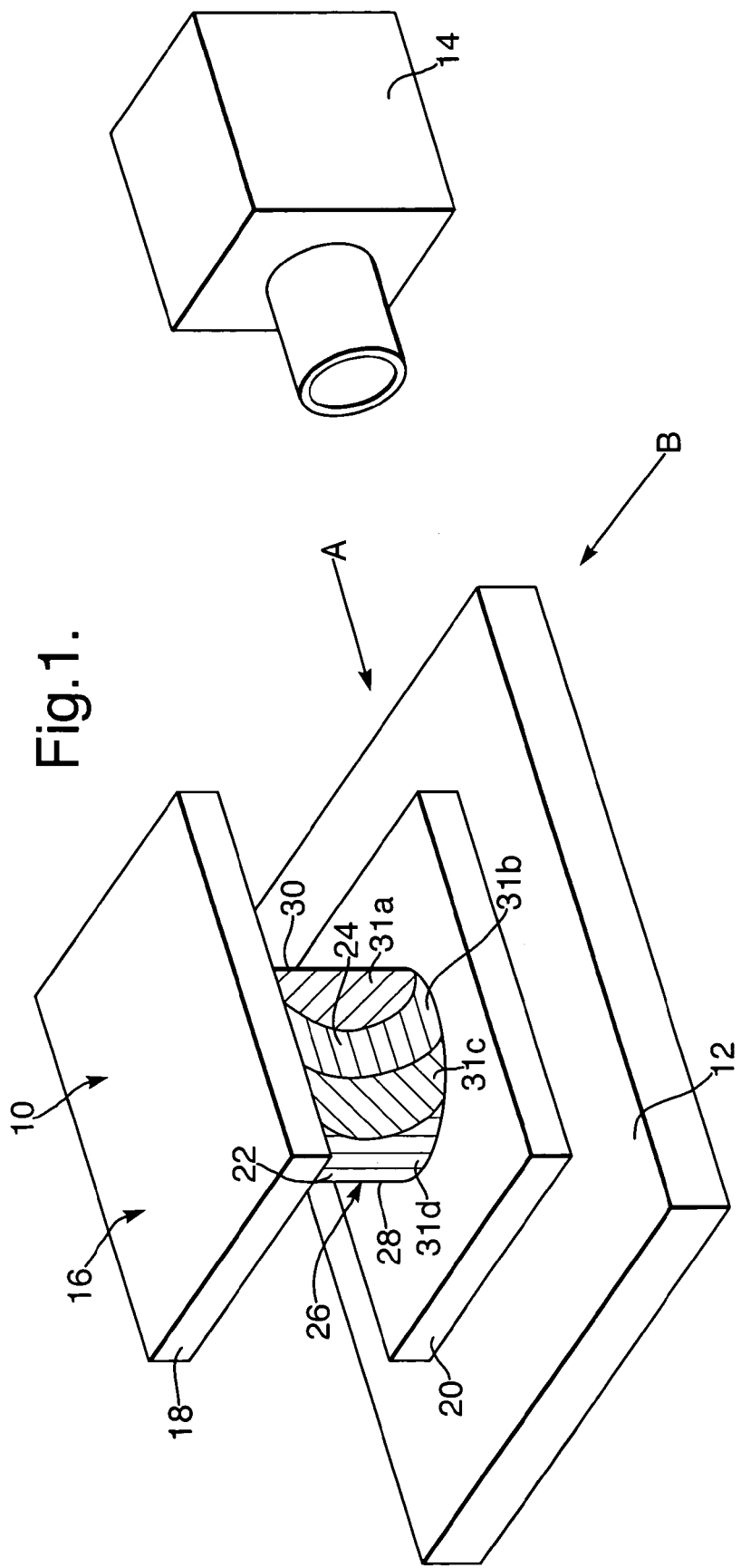
FIG. 1 shows image data capture apparatus arranged around a component.

FIG. 1 shows a component 10 located on a surface 12. A camera 14 is employed to capture 2D image data from different view points around the component 10.

In this non limiting example the component 10 is a turbine stator segment 16 comprising an inner shroud 18, an outer shroud 20 and an aerofoil section 22 fixed between the shrouds 18,20.

The aerofoil section 22 comprises a suction side 24 and a pressure side 26 (hidden from view) brought together by a leading edge 28 and a trailing edge 30.

Figure 2:
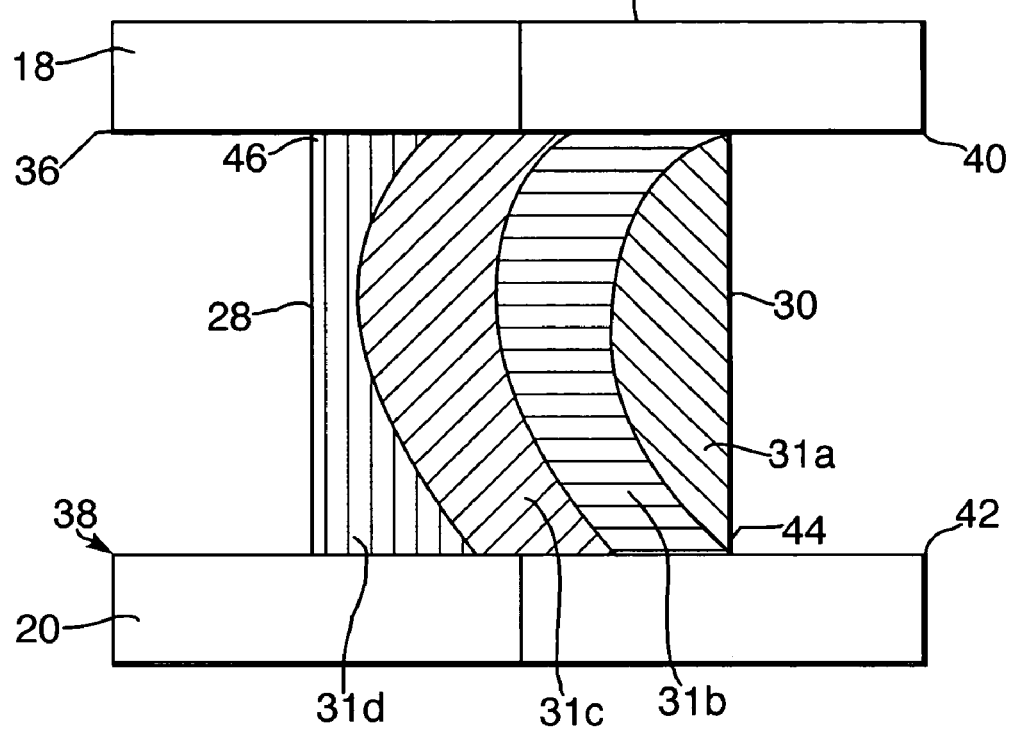
FIG. 2 represents a 2D image (a first 2D data set) of the component as viewed in the direction of arrow "A" in FIG. 1.
Figure 3:
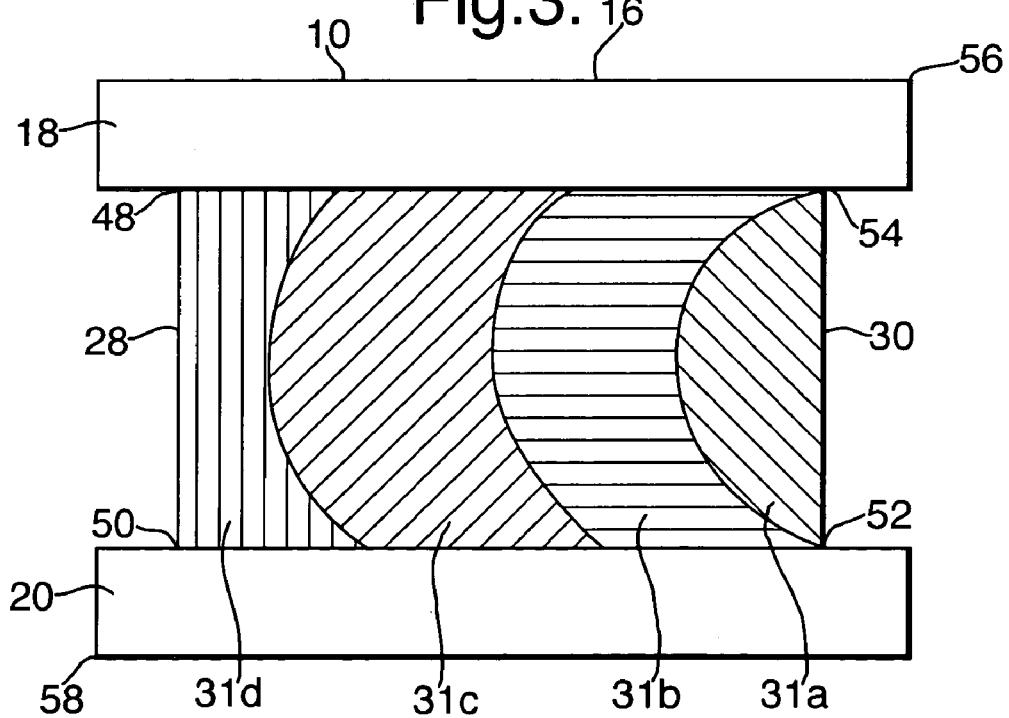
FIG. 3 shows a 2D image (a second 2D data set) of the component as viewed in the direction of arrow "B" in FIG. 1.

Although it would be obvious to one skilled in the art to capture a plurality of 2D images, for reasons of clarity the description will focus on two 2D images, which are represented in FIG. 2 and FIG. 3 as views on the component 10 as viewed in the direction of arrow "A" and arrow "B" respectively.

The two 2D images are encoded as 2D data sets. Hereafter the 2D data set derived from the end on view as shown in FIG. 2 is referred to as the first 2D data set and the 2D data set derived from the side on view as shown in FIG. 3 is referred to as the second 2D data set. In this non limiting example the component 10 is coated in a temperature indicating paint 31. When applied to the component 10 the temperature indicating paint 31 is of uniform colour. At discrete temperature values the temperature indicating paint 31 irreversibly changes colour. Since, in operation, the component 10 will not be heated to a uniform temperature, paint 31 at different regions on the component 10 will change to different colours according to the temperature of the component 10 in each region. This results in regions of different colour paint 31a–d on the component 10 surface. The 2D data sets comprise the co-ordinates of the different temperatures recorded on the surface of the component 10 as indicated by the different paint colours 31a–d.

Figure 4:
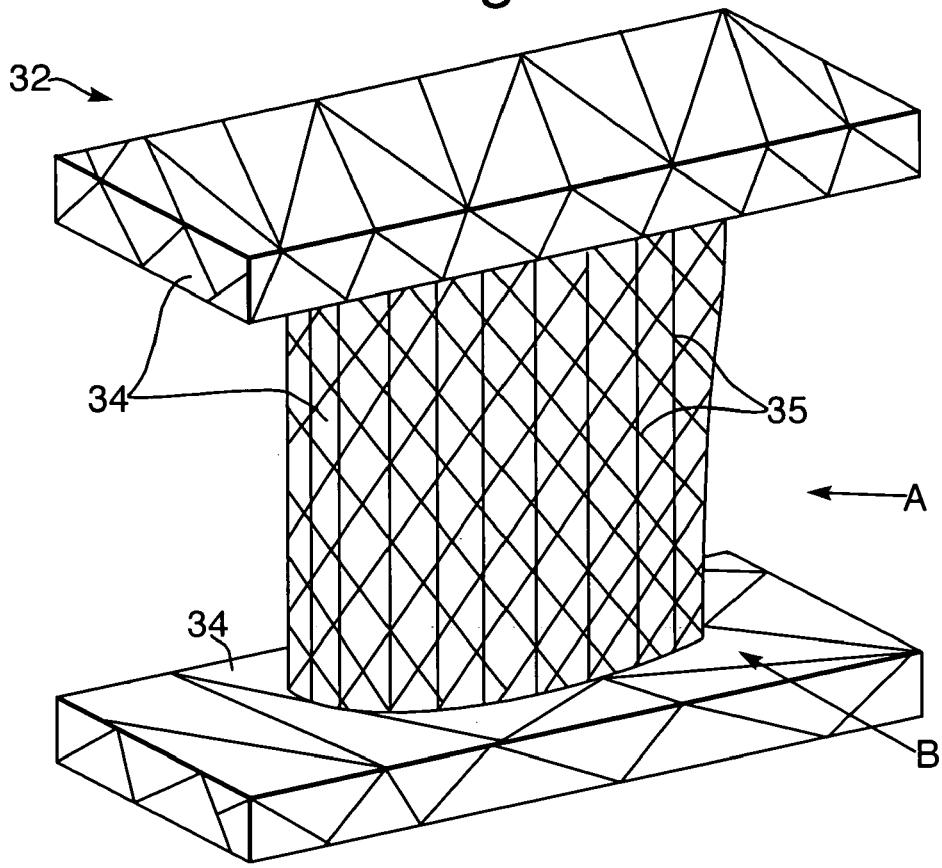
FIG. 4 represents a finite element 3D computer model of the component.

Shown in FIG. 4 is a representation of a 3D computer model 32 of the component 10, the surface defined by a plurality of polygonal elements 34 defined by nodes 35. In order to establish a mapping link between the 2D data set and the 3D computer model 32 at least six features common to both the 3D model and the 2D data set being mapped must be identified. The user chooses the common features, whose coordinates are referred to as "lock points".

Figure 5:
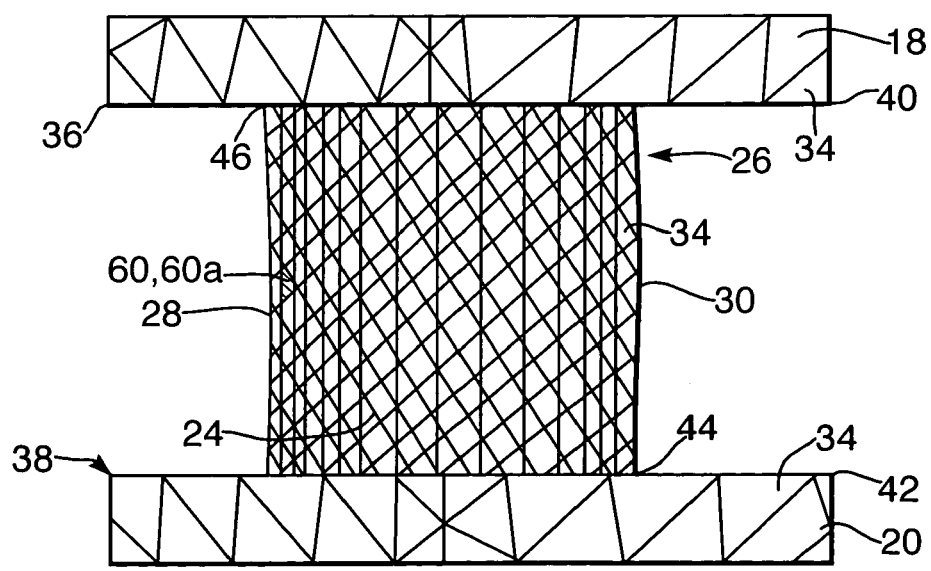
FIG. 5 represents a view of the 3D computer model as viewed in the direction of arrow "A" in FIG. 4.
Figure 6:
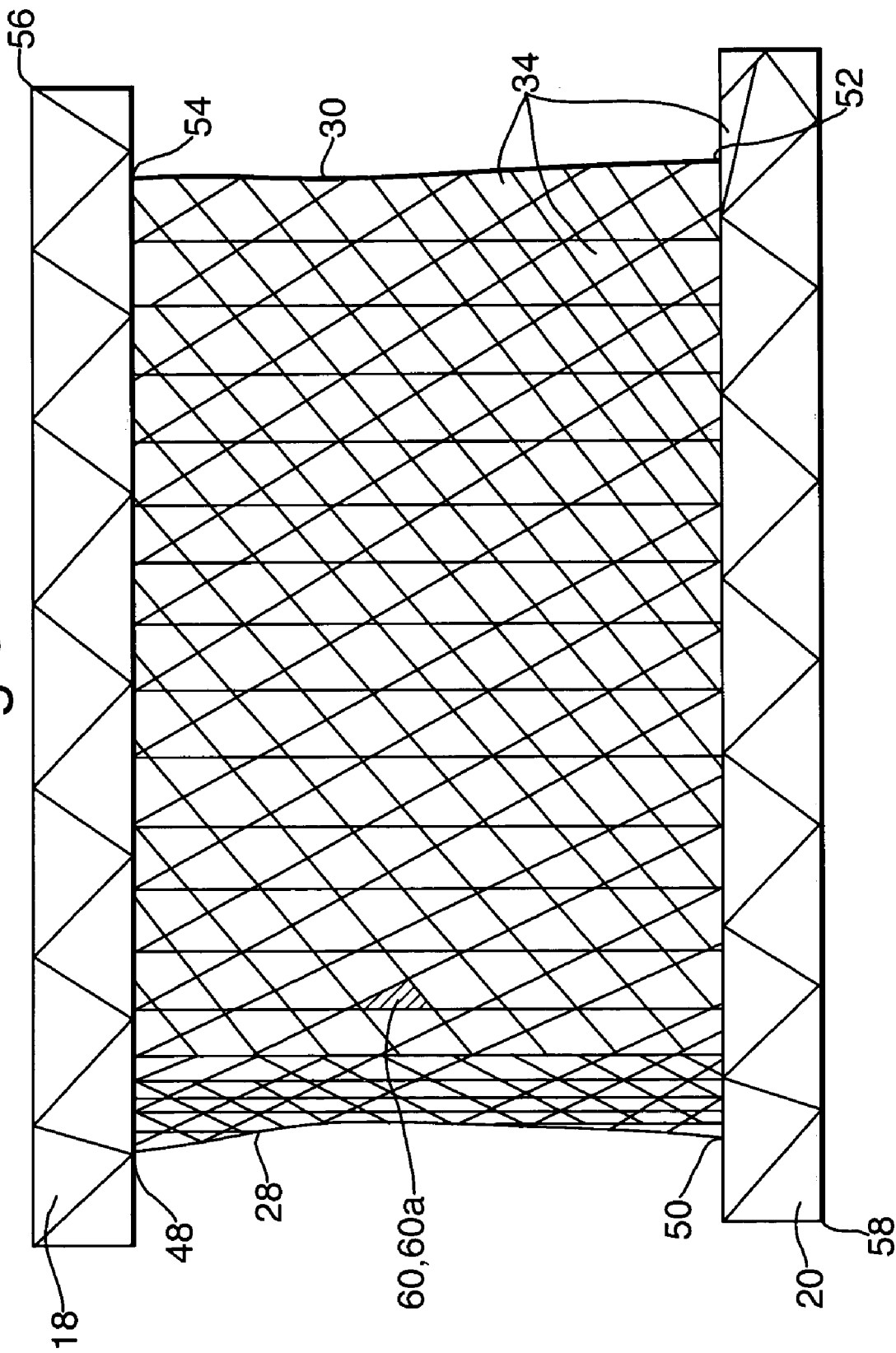
FIG. 6 represents a view of the 3D computer model as viewed in the direction of arrow "B" in FIG. 4.

The user orientates the 3D computer model 32 such that the view is similar, but not necessarily identical, to that displayed in the 2D image. Hence in mapping the first 2D data set, the 3D model 32 may be orientated as shown in FIG. 5. Likewise, in mapping the second 2D data set, the 3D model 32 may be orientated as shown in FIG. 6. The computer model 32 need only be orientated in a way that allows a clear view of points of reference common to the 3D computer model 32 and the first and/or second 2D dataset. Therefore the user may freely rotate and translate the 3D model 32 before, during and after the process of lock point selection.

Referring to FIGS. 2 and 5, and by way of non limiting example, six common features are indicated at 36,38,40,42, 44,46.

Referring to FIGS. 3 and 6, and by way of non limiting example, the six common features are indicated at 48,50, 52,54,56,58.

Knowing the position of the lock points for six features 36 to 46 or features 48 to 58 in both the 3D model space and the 2D image space it is possible to solve a set of mapping equations to allow additional points whose positions are only known in one space to be moved between the 2D data set or the 3D model.

The surface of the 3D computer model 32 is defined by polygonal elements 34 which may vary in size over the surface of component 10. Once defined, the elements 34 do not change in size for a given iteration of an analysis. In FIGS. 5 and 6 an element 60 common to both the first and second data set is highlighted, indicated as 60a and 60b respectively. In this example element 60 has data values from both the first and second 2D data set.

Figure 7:
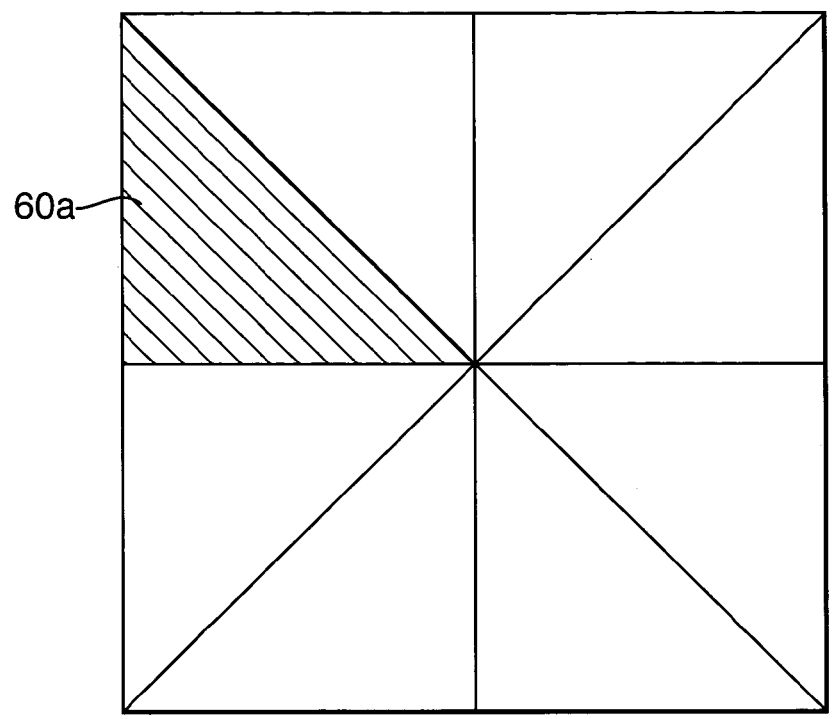
FIG. 7 is an enlarged view of element 60a as indicated in FIG. 5.
Figure 8:
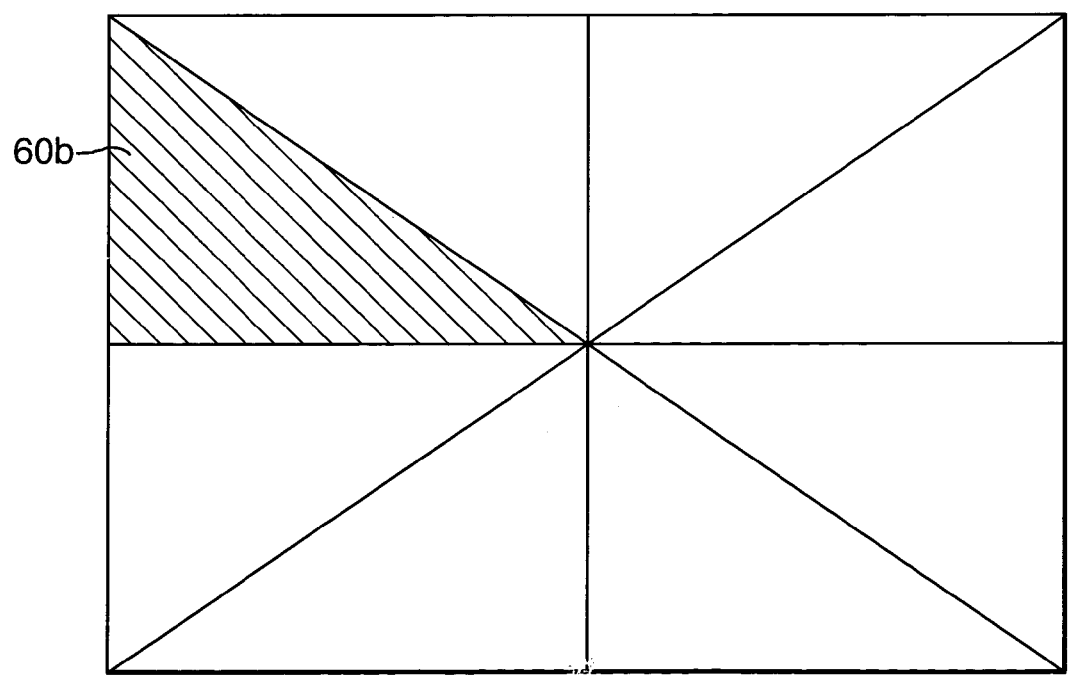
FIG. 8 is an enlarged view of element 60b as indicated in FIG. 6.

Referring now to FIGS. 7 and 8 the regions surrounding element 60 in FIGS. 5 and 6 respectively are presented as enlarged views. The element 60a (which is element 60 viewed from direction "A") has an area apparently smaller than element 60b (which is element 60 viewed from direction "B"). The data associated with the element 60 having the greater apparent area is used in preference to the data associated with the element 60 having the smaller apparent area. Hence in regions where there is more than one data value per nodal co-ordinate, the data value which is most likely to be the most accurate can be chosen, thereby resolving ambiguities in data values from different 2D data sets.

The 3D model 32, after being populated with data values from the 2D datasets, may be imported to an analysis program to determine the suitability and limits of the component design. Such analysis programs may be for analysing, for example, computational fluid dynamics, thermo-mechanical properties or mechanical properties. Hence an optimum component design may be selected based on the results of the analysis.

While the 3D model will normally contain all the nominal features of the component, there may be instances where the component is provided with extra features, perhaps because of a variation in the manufacturing process or because the component was altered in order to fit instrumentation. It will be appreciated that the present invention may also be employed to transfer geometric features present in the 2D image data set to the 3D model 32 by a method analogous to that hereinbefore described. Instead of data derived from a substance coating the surface of the component being transferred from the 2D dataset to the 3D computer model 32, such as temperature values derived from temperature indicating paint, features of the geometry captured in the 2D image and stored as a 2D dataset may be identified by the user and mapped onto the 3D computer model.

It will be appreciated that the present invention permits automation of the data capture process, hence saving time and effort when a plurality of components of substantially identical geometries are being interrogated. It has been found that if 2D image data is captured from the same view points for each of the components, then the lock points need only be defined for each view and not for each image taken from a common viewpoint. In order to facilitate this the components and image capture device may need to fixed in a suitable jig arrangement such that each of the components are presented in the same relative orientation to the image capture device.

It will be appreciated that the present invention may also be employed to aid in the visualisation of empirical data, thereby enabling a user to determine properties and behaviour of the component when in use. This may significantly aid in the further development or the component or in establishing its operational parameters.

It will be appreciated that any component may be the subject of the optimisation hereinbefore described and need not be limited to the field of gas turbine engines.

It will be appreciated that the method described herein may form part of a computer program product comprising code to carry out the design optimisation steps and a computer system adapted to carry out the design optimisation steps herein described.

It will also be appreciated that the design optimisation steps described herein may also be used as part of a method of manufacturing a component.

It will be appreciated by one skilled in the art that datasets may comprise a plurality of different datatypes.

The configurations shown in FIGS. 1 to 8 are diagrammatic. The component under interrogation, its orientation, configuration and the data type being captured may vary. Likewise, the mesh patterns, size and spacing will vary for different components and finite element analysis packages.

The invention claimed is:

1. A method of optimising a design of a component by conducting at least one analysis which incorporates empirically obtained data values, the at least one analysis comprising the steps of:
    a) representing the component as a 3D computer model having a surface defined by a plurality of nodes, said nodes further defining a plurality of polygonal elements,
    b) capturing at least two 2D data sets of the component to define surface properties of the component,
    c) representing surface properties of said component as at least two 2D images defined by the at least two 2D data sets which comprises a plurality of data values,
    d) defining at least six features common to both the at least two 2D images and the 3D computer model,
    e) identifying co-ordinates common to the at least two 2D data sets and the 3D computer model,
    f) assigning data values from at least one common co-ordinate in the at least two 2D data sets to the associated nodal co-ordinate in the 3D computer model,
    g) resolving ambiguities between values from the at least two 2D data sets assigned to common nodes, said nodes defining polygonal elements common to both 2D data sets, by determining an apparent area of said common polygonal elements from each of the at least two 2D datasets which contain an ambiguous value, and using the data value from the 2D dataset associated with the common polygonal element having the greater apparent area,
    h) employing the 3D computer model in at least one analysis to optimise the design of the said component, the method further comprising the step of selecting an optimum component design on the basis of the results of the at least one analysis.

2. A method as claimed in claim 1 wherein the method comprises the step of mapping at least one 2D data set onto the 3D computer model such that the properties of the 3D model surface comprise the 2D dataset.

3. A method as claimed in claim 1 wherein the method comprises the step of mapping at least one 2D data set onto the 3D computer model such that geometric features of the 3D model surface comprise the 2D dataset.

4. A method as claimed in claim 1 wherein the at least two 2D data sets comprise data derived from a 2D image of said component.

5. A method as claimed in claim 1 wherein the at least two 2D data sets comprise image data of said component coated with temperature indicating paint.

6. A method as claimed in claim 1 wherein the at least two 2D data sets comprise image data of said component coated with pressure sensitive paint.

7. A method as claimed in claim 1 wherein the at least two 2D data sets comprise data derived from vibration analysis.

8. A method as claimed in claim 1 wherein the at least one 2D data sets comprise data derived from pyrometry measurements.

9. A method of manufacturing a component, the method comprising the step of optimising the design of the component by a method in accordance with claim 1.

10. A method of manufacturing a component as claimed in claim 9 wherein the component is a turbine stator segment.

11. A method of manufacturing a component as claimed in claim 9 wherein the component is a turbine blade.

12. A component having a design which is optimised by a method in accordance with claim 1.

13. A component manufactured by a method comprising the step of optimising the design of the component by a method in accordance with claim 1.

14. A computer program stored on a computer readable medium, wherein the computer program comprises code for carrying out a method in accordance with claim 1.

* * * * *